United States Patent
Misumi et al.

(10) Patent No.: US 10,409,161 B2
(45) Date of Patent: Sep. 10, 2019

(54) POSITIVE TYPE PHOTOSENSITIVE SILOXANE COMPOSITION

(71) Applicant: AZ Electronic Materials (Luxembourg) S.a.r.l., Luxembourg (LU)

(72) Inventors: Motoki Misumi, Otsu (JP); Daishi Yokoyama, Kakegawa (JP); Megumi Takahashi, Kakegawa (JP); Toshiaki Nonaka, Tokyo (JP)

(73) Assignee: AZ Electronic Materials (Luxembourg) S.a.r.l., Luxembourg (LU)

(*) Notice: Subject to any disclaimer, the term of this patent is extended or adjusted under 35 U.S.C. 154(b) by 0 days.

(21) Appl. No.: 16/078,767

(22) PCT Filed: Jan. 20, 2017

(86) PCT No.: PCT/EP2017/000070
§ 371 (c)(1),
(2) Date: Aug. 22, 2018

(87) PCT Pub. No.: WO2017/144148
PCT Pub. Date: Aug. 31, 2017

(65) Prior Publication Data
US 2019/0064660 A1    Feb. 28, 2019

(30) Foreign Application Priority Data

Feb. 23, 2016  (JP) ................ 2016-032209

(51) Int. Cl.
| | | |
|---|---|---|
| *G03F 7/023* | (2006.01) | |
| *G03F 7/004* | (2006.01) | |
| *G03F 7/022* | (2006.01) | |
| *G03F 7/075* | (2006.01) | |
| *C08K 5/08* | (2006.01) | |
| *C08L 83/04* | (2006.01) | |
| *G03F 7/039* | (2006.01) | |

(52) U.S. Cl.
CPC ......... *G03F 7/0226* (2013.01); *G03F 7/0045* (2013.01); *G03F 7/0233* (2013.01); *G03F 7/0757* (2013.01); *C08K 5/08* (2013.01); *C08L 83/04* (2013.01); *G03F 7/0392* (2013.01)

(58) Field of Classification Search
CPC ..... G03F 7/0226; G03F 7/0757; G03F 7/0233
USPC .................. 430/18, 191, 192, 193
See application file for complete search history.

(56) References Cited

U.S. PATENT DOCUMENTS

| | | | |
|---|---|---|---|
| 2012/0070781 A1* | 3/2012 | Katayama | ............ C07D 295/18 430/281.1 |
| 2012/0183751 A1* | 7/2012 | Katayama | ............ C07D 295/18 428/195.1 |
| 2013/0216952 A1 | 8/2013 | Yokoyama et al. | |
| 2014/0335448 A1 | 11/2014 | Sekito et al. | |
| 2014/0335452 A1 | 11/2014 | Yokoyama et al. | |
| 2015/0291749 A1 | 10/2015 | Nonaka et al. | |

FOREIGN PATENT DOCUMENTS

| | | |
|---|---|---|
| EP | 2799928 A1 | 11/2014 |
| JP | 2933879 B2 | 8/1999 |
| JP | 2961722 B2 | 10/1999 |
| JP | 3783512 B2 | 6/2006 |
| JP | 2011052214 A | 3/2011 |
| JP | 2012113256 A | 6/2012 |
| JP | 2012118523 A | 6/2012 |
| JP | 2012224770 A | 11/2012 |
| JP | 2013109216 A | 6/2013 |
| JP | 2013120292 A | 6/2013 |
| JP | 2014198403 A | 10/2014 |
| WO | WO-2012161025 A1 | 11/2012 |
| WO | WO-2014080827 A1 | 5/2014 |

OTHER PUBLICATIONS

International Search Report for PCT/EP2017/000070 dated Apr. 21, 2017.
Written Opinion of the International Searching Authority for PCT/EP2017/000070 dated Apr. 21, 2017.

* cited by examiner

*Primary Examiner* — John S Chu
(74) *Attorney, Agent, or Firm* — Drinker Biddle & Reath LLP

(57) ABSTRACT

To provide a positive type photosensitive composition capable of forming a pattern of high resolution, of high heat resistance and of high transparency without emitting harmful volatile substances such as benzene, also capable of reducing pattern defects caused by development residues, by undissolved residues, or by reattached hardly-soluble trace left in pattern formation, and further capable of being excellent in storage stability. The present invention provides a positive type photosensitive siloxane composition comprising: a polysiloxane having a phenyl group, a diazonaphthoquinone derivative, a hydrate or solvate of a photo base-generator having a particular nitrogen-containing hetero-cyclic structure, and an organic solvent.

17 Claims, No Drawings

POSITIVE TYPE PHOTOSENSITIVE SILOXANE COMPOSITION

CROSS-REFERENCE TO RELATED APPLICATIONS

This application is a national stage application (under 35 U.S.C. § 371) of PCT/EP2017/000070, filed Jan. 20, 2017, which claims benefit of Japanese Application No. 2016-032209, filed Feb. 23, 2016, both of which are incorporated herein by reference in their entirety.

TECHNICAL FIELD

The present invention relates to a positive type photosensitive siloxane composition. Further, this invention also relates to a cured film formed from the composition, and a device comprising the cured film.

BACKGROUND ART

In the field of optical devices, such as, displays, light emitting diodes and solar cells, various proposals have been recently made for the purposes of energy conservation and of improvement in light utilization efficiency. For example, there is a known method for increasing the aperture ratio of a liquid crystal display. In that method, a transparent planarization film is formed to cover a TFT element and then pixel electrodes are formed on the planarization film (see, Patent document 1).

As materials for the planarization film formed on the TFT substrate, it is known to adopt an acrylic resin and a quinone diazide compound in combination (see, Patent documents 2 and 3). Those materials have both photosensitivity and planarization properties, and hence can form a contact hole and other patterns. However, wiring has become complicated in accordance with improvement of the resolution and frame frequency, and accordingly planarization conditions have become so severe that it has been getting difficult for the above materials to satisfy the conditions.

Meanwhile, polysiloxanes are known as a material for forming a cured film of high heat resistance, of high transparency and of high resolution. Particularly among them, silsesquioxane derivatives have been widely employed because they have low permittivity, high transparency, high heat resistance, tough UV durability, and good coating uniformity. A silsesquioxane is a polymer comprising a trifunctional siloxane structural unit $RSi(O_{1.5})$, which can be considered to have an intermediate chemical structure between an inorganic silica structure ($SiO_2$) and an organic silicone ($R_2SiO$). This polymer is such a specific compound as is soluble in an organic solvent but forms a cured product characteristically having high heat resistance almost comparable to that of inorganic silica.

A phenyl-containing polysiloxane is known to be inexpensive and high in safety. For example, there is a known photosensitive material comprising a phenyl-containing polysiloxane, a quinone diazide compound, a solvent and a surfactant. This photosensitive material is characterized in that the polysiloxane has high solubility in the solvent and also in that a cured film formed therefrom hardly suffers from cracking. Specifically, the cured film formed from that material is excellent in high-temperature durability and in uniformity, and also has high transparency, low permittivity, good electrical insulating properties, and tough chemical resistance (see, Patent documents 4 and 5). However, the phenyl-containing polysiloxane has a problem of emitting harmful and carcinogenic volatile substances, such as benzene, in the thermal curing process.

In view of the above, it is proposed to adopt a silsesquioxane having an aryl group (which is not a phenyl group but a substituent-containing phenyl group) so as to produce a photosensitive siloxane composition which does not emit benzene (see, Patent documents 6 and 7). However, that kind of siloxane tends to cost a lot because produced by a special process. Further, it also tends to be inferior to the phenyl-containing polysiloxane in high-temperature durability and in UV durability. Furthermore, the above composition tends to undergo gelation if a photo base-generator, which is known to be used for the purpose of promoting polymerization of resins (see, Patent documents 8 and 9), is employed for polymerization of the siloxane.

PRIOR ART DOCUMENTS

Patent Documents

[Patent document 1] Japanese Patent No. 2933879
[Patent document 2] Japanese Patent No. 2961722
[Patent document 3] Japanese Patent No. 3783512
[Patent document 4] WO2012/161025
[Patent document 5] WO2014/080827
[Patent document 6] Japanese Patent Laid-Open No. 2013-109216
[Patent document 7] Japanese Patent Laid-Open No. 2013-120292
[Patent document 8] Japanese Patent Laid-Open No. 2012-113256
[Patent document 9] Japanese Patent. Laid-Open No. 2012-224770

DISCLOSURE OF INVENTION

Problem to be Solved by the Invention

The present invention is achieved in consideration of the above background, and aims to provide a positive type photosensitive siloxane composition which does not emit harmful volatile substances such as benzene, also which can form a pattern of high resolution, of high heat resistance and of high transparency, still also which reduces pattern defects caused by development residues, by undissolved residue, or by reattached-hardly-soluble trace left in pattern formation, and further which is excellent in storage stability.

It is another object of the present invention to provide a cured film, such as a planarization film for a TFT substrate or an interlayer insulating film, formed from the above positive type photosensitive siloxane composition, and still another object of the present invention is to provide an optical or semiconductor device comprising that cured film. Examples of the optical device include: liquid crystal displays, organic EL displays, solid state image sensors, anti-reflection panels or films, optical filters, high brightness LED devices, touch panels, solar cells and optical waveguides.

Means for Solving Problem

The present invention provides a positive type photosensitive siloxane composition comprising:
(I) a polysiloxane having a substituted or unsubstituted phenyl group,
(II) a diazonaphthoquinone derivative, (III) a hydrate or solvate of a photo base-generator represented by the following formula (IIIa):

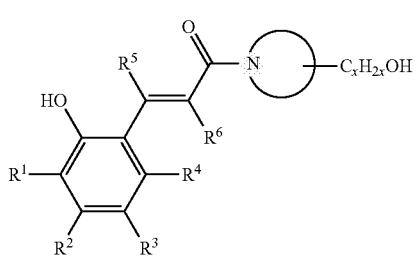
(IIIa)

in which
x is an integer of 1 to 6 inclusive,
each of $R^1$ to $R^6$ is independently hydrogen, a halogen, hydroxyl, mercapto, sulfide, silyl, silanol, nitro, nitroso, sulfino, sulfo, sulfonate, phosphino, phosphinyl, phosphono, phosphonato, amino, ammonium, an aliphatic hydrocarbon group of 1 to 20 carbon atoms which may have a substituent, an aromatic hydrocarbon group of 6 to 22 carbon atoms which may have a substituent, an alkoxy group of 1 to 20 carbon atoms which may have a substituent, or an aryloxy group of 6 to 20 carbon atoms which may have a substituent,
two or more of $R^1$ to $R^4$ may be linked to form a cyclic structure, wherein
said cyclic structure may contain a hetero atom,
and
N is a constituting atom of a nitrogen-containing heterocyclic ring, wherein
said nitrogen-containing heterocyclic ring is a 3- to 10-membered ring, and
said nitrogen-containing heterocyclic ring may further contain an aliphatic hydrocarbon group of 1 to 20 carbon atoms which may have a substituent, provided that said aliphatic hydrocarbon group is different from the $C_xH_{2x}OH$ group, and
(IV) an organic solvent.

The present invention also provides a cured film formed in a manner where the above positive type photosensitive siloxane composition is coated on a substrate and then heated.

The present invention further provides a device comprising the above cured film.

Effect of the Invention

The positive type photosensitive siloxane composition according to the present invention hardly undergoes thermal decomposition, which causes emission of volatile substances such as benzene, xylene and toluene, when used in production of semiconductor devices and the like. Accordingly, in the production process, the siloxane composition can form a film suppressing changing the film thickness and properties, and gives no unfavorable effects on human bodies and does not pollute the production system. In addition, the composition is of high sensitivity and of high resolution. Further, the composition can form a cured film excellent in storage stability, in heat resistance, in transparency and in remaining film ratio, and also can reduce pattern defects caused by development residues, by undissolved residue or by reattached hardly-soluble trace. Furthermore, the thus formed cured film is excellent in planarization and in electrical insulating properties, and hence can be favorably employed as a material for optical elements, such as, optical waveguides, as well as, as a material for various films, such as, planarization films on thin-film transistor (TFT) substrates, which are used as backplanes of displays such as LCD devices or organic EL devices; interlayer insulating films in semiconductor devices; and other insulating films or transparent protective films of solid state image sensors, of antireflection panels or films, of optical filters, of high brightness LED devices, of touch panels, and of solar cells.

BEST MODE FOR CARRYING OUT THE INVENTION

The positive type photosensitive siloxane composition (hereinafter, often simply referred to as "composition") according to the present invention comprises: a polysiloxane, a diazonaphthoquinone derivative, a hydrate or solvate of a particular photo base-generator, and an organic solvent. Those ingredients contained in the composition will be individually explained below in detail.

(I) Polysiloxane

The composition according to the present invention contains a polysiloxane which is substituted with a substituted or unsubstituted phenyl group. The phenyl group may be substituted with an alkyl group of 1 to 3 carbon atoms, an alkoxy group of 1 to 3 carbon atoms, hydroxyl, amino or the like, and may have two or more substituents. Examples of the substituted phenyl group include tolyl, xylenyl, ethylphenyl and hydroxyphenyl groups.

The term "polysiloxane" generally means a polymer having Si—O—Si bonds. The present invention adopts an organic polysiloxane having a structure in which hydrogens in an unsubstituted inorganic polysiloxane are partly substituted with substituted or unsubstituted phenyl groups. This kind of polysiloxane generally has silanol groups or alkoxysilyl groups. The terms "silanol groups" and "alkoxysilyl groups" mean hydroxyl groups and alkoxy groups, respectively, which directly connect to silicon atoms constituting the siloxane skeleton. Those groups have a function of promoting a curing reaction when the composition forms a cured film. Accordingly, the polysiloxane preferably has those groups.

The polysiloxane used in the present invention is not particularly restricted on its skeletal structure, and can be freely selected in accordance with the aimed applications. According to the number of oxygen atoms connecting to a silicon atom, the structure of polysiloxane can be generally categorized into the following three skeletons, that is: silicone skeleton (in which two oxygen atoms connect to a silicon atom), silsesquioxane skeleton (in which three oxygen atoms connect to a silicon atom), and silica skeleton (in which four oxygen atoms connect to a silicon atom). In the present invention, the polysiloxane may have any of those skeletons. Further, the structure of the polysiloxane molecular may be a combination of two or more of them.

In the present invention, the polysiloxane may have substituents other than phenyl groups unless they impair the effect of the present invention. Those substituent groups are, for example, groups having no Si—O bonds, which constitute the siloxane structure. Examples thereof include alkyl groups, hydroxyalkyl groups, aryl groups, and groups in which hydrogen atoms in those groups are substituted with unsaturated hydrocarbon groups.

The polysiloxane may have reactive groups other than the silanol or alkoxysilyl groups, such as, carboxyl groups, sulfonyl groups, and amino groups, unless they impair the effect of the present invention. However, those reactive groups generally tend to lower the storage stability of the composition, and hence they are preferably contained in a small amount. Specifically, the amount thereof is preferably 10 mol % or less based on the total number of hydrogen atoms or substituent groups connecting to silicon atoms. Further, those reactive groups are particularly preferably not contained at all.

It is for the purpose of forming a cured film that the composition of the present invention is coated on a substrate, imagewise exposed to light and then developed. This means that there must be a difference in solubility between the exposed area and the unexposed area. For example, if the formed film has a dissolution rate of 50 Å/second or more in a 2.38% aqueous solution of tetramethylammonium hydroxide (hereinafter often referred to as "TMAH"), it is thought to be possible to produce a positive type pattern by exposure-development procedures. However, the required solubility depends on the thickness of the film and the development conditions, and hence the polysiloxane must be appropriately selected according to the development conditions.

If the polysiloxane is simply selected only because capable of forming a film of high dissolution rate, there are often problems of deformation of the pattern, lowering of the remaining film ratio and deterioration of the transparency. In order to improve those problems, that polysiloxane can be used in a mixture with another one which forms a film of low dissolution rate.

The polysiloxane mixture comprises, for example,
(H): a first polysiloxane which forms a film soluble after prebaked in a 1.19 wt % TMAH aqueous solution at a dissolution rate of 1500 Å/second or less,
(M): a polysiloxane which forms a film soluble after prebaked in a 2.38 wt % TMAH aqueous solution at a dissolution rate of 500 Å/second or more, and
(L): a polysiloxane which forms a film soluble after prebaked in a 5 wt % TMAH aqueous solution at a dissolution rate of 200 to 1000 Å/second inclusive.

If capable of forming a film having a dissolution rate of 100 to 4000 Å/second in a 2.38 wt % TMAH aqueous solution, a mixture of two or more polysiloxanes providing different dissolution rates in the TMAH aqueous solution can be employed for constituting the photosensitive siloxane composition which is intended to be used in combination with a 2.38 wt % TMAH aqueous solution serving as a developer. Accordingly, the amounts of the two or more polysiloxanes, namely, those of the polysiloxanes (H), (M) and (L) are determined in consideration of their dissolving properties so that the mixture can form a film having a dissolution rate of 100 to 4000 Å/second in a 2.38 wt % TMAH aqueous solution.

In a process for forming a pattern from the composition of the present invention, the above positive type photosensitive siloxane composition is coated on a substrate to form a film, which is subsequently exposed to light and then developed. After developed, the film is preferably heated at 200° C. or higher to obtain a cured film. In this procedure, the developed pattern often undergoes thermal-flow. In order to suppress the thermal-flow for keeping the pattern shape, the weight ratio of the polysiloxanes (H) and (M) in total to the polysiloxane (L) is preferably 95/5 to 30/70. If the polysiloxane (L) is contained in an amount of more than 70 weight parts, the sensitivity is so impaired that the composition cannot be practically used. However, if the amount of the polysiloxane (L) is 5 weight parts or less, the pattern shape cannot be maintained.

Each of the polysiloxanes (H), (M) and (L) has a weight average molecular weight (Mw) of preferably 800 to 8000, more preferably 800 to 5000. If the weight average molecular weight (Mw) is less than 800, the composition has little effect of preventing "pattern" collapse. If it is more than 8000, the polysiloxane dissolves insufficiently in the development procedure to leave undissolved residues, which may impair the resolution and sensitivity.

The polysiloxanes (H), (M) and (L) will be further described below in more detail. The differences among their dissolution rates can be controlled by changing the reaction time with acid catalyst or by changing the amount of water added in a reaction with alkali catalyst, and hence the polysiloxanes (H), (M) and (L) can be synthesized similarly in the following manner except for changing appropriately the reaction time or the amount of water. Accordingly, when it is unnecessary to individualize the polysiloxanes (H), (M) and (L), they are individually simply referred to as "polysiloxane" without distinction in the following description.

For synthesizing a polysiloxane, any silane compound can be adopted as a starting material. For example, it is possible to use a compound represented by the following formula (Ia):

$$R^{10}{}_{n1}Si(OR^{11})_{4-n1} \quad (Ia).$$

In the formula, $R^{10}$ is a substituted or unsubstituted phenyl group, a straight, branched or cyclic alkyl group of 1 to 20 carbon atoms in which any methylene may be replaced with oxygen, or an aryl group of 6 to 20 carbon atoms in which any hydrogen may be replaced with fluorine; $R^{11}$ is hydrogen or an alkyl group of 1 to 10 carbon atoms, preferably, an alkyl group of 1 to 6 carbon atoms. Here, the "substituted or unsubstituted phenyl group" means the same as described above. Specifically, the phenyl group may be substituted with an alkyl group of 1 to 3 carbon atoms, an alkoxy group of 1 to 3 carbon atoms, hydroxyl, amino or the like, and also may have two or more substituents. The number represented by n1 is 0, 1 or 2. The silane compound represented by the formula (Ia) may be used in combination of two or more kinds thereof. If a mixture of polysiloxanes is adopted in the present invention, the substituted or unsubstituted phenyl group needs to be included in at least one of the polysiloxanes. In other words, if the polysiloxane used in the present invention is synthesized from silane compounds of the formula (Ia) as starting materials, at least one of them necessarily includes the substituted or unsubstituted phenyl group.

In the formula (Ia), $R^{10}$ may be a straight, branched or cyclic alkyl group of 1 to 20 carbon atoms in which any methylene may be replaced with oxygen. Examples thereof include: methyl, ethyl, n-propyl, iso-propyl, t-butyl, n-hexyl, n-decyl, trifluoromethyl, 2,2,2-trifluoroethyl, 3,3,3-trifluoropropyl, and cyclohexyl. On the other hand, naphthyl is an example of the aryl group of 6 to 20 carbon atoms in which any hydrogen may be replaced with fluorine. The compound having a methyl group as $R^{10}$ is particularly preferred because that material is easily available and the resultant cured film has sufficient hardness and high chemical resistance.

However, even in the case where $R^{10}$ is a methyl group, the resultant film may have poor durability against a resist remover if the polysiloxane (I) contains the methyl groups of $R^{10}$ in an insufficient amount. In contrast, if the methyl groups of $R^{10}$ are contained too much, the siloxane activity is enhanced excessively to cause formation of insoluble matters. Accordingly, the polysiloxane (I) preferably comprises 20 to 80 mol % of the units derived from the silane compound of the formula (Ia) in which $R^{10}$ is methyl group. Similarly, at least one of the polysiloxanes (H), (M) and (L) preferably comprises 20 to 80 mol % of the units derived from the silane compound of the formula (Ia) in which $R^{10}$ is methyl group. Further, if two of the polysiloxanes (H), (M) and (L) are selected and mixed, at least either of them comprises 20 to 80 mol % of the units derived from the silane compound in which $R^{10}$ is methyl group. It is particularly preferred for each of the polysiloxanes (H), (M) and (L) to comprise 20 to 80 mol % of those units.

If two or more compounds represented by the formula (Ia) are employed, $R^{10}$s in those compounds may be the same as or different from each other.

Examples of $R^{11}$ include an alkyl group, such as, methyl, ethyl, n-propyl, iso-propyl, and n-butyl groups. The formula (Ia) has two or more $R^{11}$s, which may be the same as or different from each other. Further, if two or more compounds represented by the formula (Ia) are employed, $R^{11}$s in those compounds may be the same as or different from each other.

Concrete examples of the silane compound represented by the formula (Ia) under n1=1 include: methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyitrimethoxysilane, phenyltrimethoxysilane, phenyltriethoxysilane, trifluoromethyltrimethoxysilane, trifluoromethyltriethoxysilane, and 3,3,3-trifluoropropyltrimethoxysilane. Among them, preferred are methyltrimethoxysilane, methyltriethoxysilane, phenyltrimethoxysilane and phenyltriethoxysilane because they are easily available.

Concrete examples of the silane compound represented by the formula (Ia) under n1=0 include: tetramethoxysilane, tetraethoxysilane, tetrapropoxysilane, and tetrabutoxysilane. Among them, preferred are tetramethoxysilane and tetraethoxysilane because they have high reactivity.

Further, concrete examples of the silane compound represented by the formula (Ia) under n1=2 include: dimethoxysilane, diethoxysilane, dipropoxysilane, and dibutoxysilane.

When formed from a mixture of the polysiloxanes (H), (M) and (L), the "pattern" comes to hardly suffer from thermal flow according as the content of silica structures corresponding to n1=0 in the mixture increases to improve the crosslink density. On the other hand, the polysiloxane (H) also has an effect of preventing the "pattern" from thermal flow, but is not preferred in view of development residues because it comprises hardly-soluble moieties. As described above, since the "pattern" can be prevented from thermal flow by increasing the content of silica structures corresponding to n1=0, it is possible to lower the blending amount of the polysiloxane (H). However, if silica structures corresponding to n1=0 are included too much, the reactivity of polysiloxane is so enhanced that insoluble matters may be formed in the development procedure. In consideration of those, the polysiloxane mixture preferably includes silica structures corresponding to the formula (Ia) under n1=0 in a content of 5 to 30 mol %. For example, the polysiloxane (H) includes silica structures corresponding to n1=0 preferably in a content of 30 mol % or less. The polysiloxane (M) also includes those structures preferably in a content of 30 mol % or less, and the polysiloxane (L) still also includes them preferably in a content of 30 mol % or less. Silica structures corresponding to n1=2 have straight-chain structures, and the heat resistance may be impaired if the content thereof is increased. Accordingly, they are preferably included in a content of 30 mol % or less.

The polysiloxane of the present invention is produced in a manner where the silane compound represented by the formula (Ia) is hydrolyzed and condensed in the presence of an acidic or basic catalyst.

A polysiloxane synthesized by use of basic catalyst is preferably adopted as the polysiloxane (L) because the photosensitive siloxane composition produced therefrom has an excellent effect of preventing the "pattern" from thermal flow.

The polysiloxane can be produced by the steps of: dropping a mixture of the silane compounds represented by the formula (Ia) into a mixed solution of an organic solvent, catalyst and water, so as to conduct hydrolysis and condensation reactions; neutralizing, purifying by washing, or condensing the reaction solution, if necessary; and replacing the reaction solvent with a desired organic solvent, if necessary.

The organic solvent used in the above reactions may be a single solvent or a mixture of two or more solvents in combination. Examples of the solvent include: hydrocarbons, such as, hexane, toluene, xylene and benzene; ethers, such as, diethyl ether and tetrahydrofuran; esters, such as, ethyl acetate; alcohols, such as, methanol, ethanol, isopropanol and butanol; and ketones, such as, acetone, methyl ethyl ketone and methyl isobutyl ketone. The amount of the organic solvent is generally 0.1 to 10 times by weight, preferably 0.5 to 5 times by weight of the mixture of the silane compounds.

The temperature at which the mixture of the silane compounds is dropped and the reactions are conducted is generally 0 to 200° C., preferably 5 to 60° C. The dropping temperature may be the same as or different from the reaction temperature. The reaction time depends on the substituent $R^{11}$ in the formula (Ia) of the silane compound, but is normally several tens of minutes to several tens of hours. Various conditions of the hydrolysis and condensation reactions, such as, the amount of the catalyst, the reaction temperature and the reaction time, are appropriately selected in consideration of the reaction scale and the size and shape of the reaction vessel, so as to obtain properties suitable for the aimed use.

Examples of the basic catalyst include: organic bases, such as, triethylamine, tripropylamine, tributylamine, tripentylamine, trihexylamine, triheptylamine, trioctylamine, diethylamine, triethanolamine, diethanolamine, and alkoxysilane having amino group; inorganic bases, such as, sodium hydroxide and potassium hydroxide; anion exchange resin; and tertiary ammonium salts, such as, tetrabutylammonium hydroxide, tetraethylammonium hydroxide, tetramethylammonium hydroxide and choline. The amount of the catalyst is preferably 0.0001 to 10 times by mol of the mixture of the silane compounds.

If the basic catalyst is used, the degree of the hydrolysis can be controlled by how much water is added. The added amount of water depends on the kind and amount of the used silane compound. However, for synthesizing the polysiloxane (H), it is generally preferred to make water react with hydrolytic alkoxy groups in the silane compound of the formula (Ia) in an amount of 0.01 to 10 times by mol, preferably 0.5 to 0.9 times by mol of the groups. For synthesizing the polysiloxane (M), it is preferred to make water react with hydrolytic alkoxy groups in the silane compound of the formula (Ia) in an amount of 0.01 to 10 times by mol, preferably 1.4 to 2.0 times by mol of the groups. For synthesizing the polysiloxane (L), it is preferred to make water react with hydrolytic alkoxy groups in the silane compound of the formula (Ia) in an amount of 0.01 to 10 times by mol, preferably 0.9 to 1.4 times by mol of the groups.

After the reactions are completed, the reaction solution may be made neutral or weakly acidic by use of an acidic compound as a neutralizer. Examples of the acidic compound include: inorganic acids, such as, phosphoric acid, nitric acid, sulfuric acid, hydrochloric acid and hydrofluoric acid; and organic acids, such as, acetic acid, trifluoroacetic acid, formic acid, lactic acid, acrylic acid, multivalent carboxylic acids (e.g., oxalic acid, maleic acid, succinic acid, citric acid) and anhydrides thereof, and sulfonic acids (e.g., p-toluenesulfonic acid and methanesulfonic acid). Further, cation exchange resin can be used as a neutralizer.

The amount of the neutralizer is appropriately selected according to pH of the reaction solution containing the polysiloxane, but is preferably 0.5 to 1.5 times by mol, more preferably 1 to 1.1 times by mol of the basic catalyst.

Examples of the acidic catalyst include hydrochloric acid, nitric acid, sulfuric acid, hydrofluoric acid, phosphoric acid, acetic acid, trifluoroacetic acid, formic acid, multivalent carboxylic acids and anhydrides thereof, and ion exchange resin. The amount of the catalyst depends on the strength of the acid, but is preferably 0.0001 to 10 times by mol of the mixture of the silane compounds.

If the acidic catalyst is used, the degree of the hydrolysis can be generally controlled by stirring time although it varies according to the kind and amount of the used silane compound. The stirring time is preferably 1 to 5 hours for synthesizing the polysiloxane (H), preferably 5 to 8 hours for synthesizing the polysiloxane (M), or preferably 8 to 12 hours for synthesizing the polysiloxane (L).

The reaction solution may be neutralized after the reactions are completed in the same manner as in the case where the basic catalyst is adopted. In this case, however, basic compounds are employed as the neutralizer. Examples of the basic compounds used for neutralization include: organic bases, such as, triethylamine, tripropylamine, tributylamine, tripentylamine, trihexylamine, triheptylamine, trioctylamine, diethylamine, triethanolamine, and diethanolamine; inorganic bases, such as, sodium hydroxide and potassium hydroxide; and tertiary ammonium salts, such as, tetrabutylammonium hydroxide, tetraethylammonium hydroxide, and tetramethylammonium hydroxide. In addition, anion exchange resin is also employable. The amount of the neutralizer is preferably 0.5 to 1.5 times by mol, more preferably 1 to 1.1 times by mol of the acidic catalyst.

According to necessity for the coating film or storage stability, the reaction solution after neutralized can be washed and purified. Specifically, hydrophobic organic solvent and water, if necessary, are added to the reaction solution after neutralized, and then the mixture was stirred and thereby the organic solvent is brought into contact with the polysiloxane so as to dissolve at least the polysiloxane in the hydrophobic organic solvent phase. As the hydrophobic organic solvent, a compound capable of dissolving the polysiloxane but immiscible with water is employed. Here, the compound "immiscible with water" means that, even if water and the compound are well mixed, the mixture separates into an aqueous phase and an organic phase while left to stand.

Preferred examples of the hydrophobic organic solvent include: ethers, such as, diethyl ether; esters, such as, ethyl acetate; alcohols, such as, butanol; ketones, such as, methyl ethyl ketone and methyl isobutyl ketone; and aromatic solvents, such as, toluene and xylene. The hydrophobic organic solvent used in washing may be the same as or different from the organic solvent used as the reaction solvent, and further two or more solvents may be mixed to use. In this washing step, most of the basic or acidic catalyst used in the reactions, the neutralizer, salts formed by the neutralization, and by-products of the reactions, such as, alcohols and water, are contained in the aqueous phase and hence essentially removed from the organic phase. The times of washing can be desirably determined according to required coating properties and storage stability.

The temperature in washing is not particularly restricted, but is preferably 0 to 70° C., more preferably 10 to 60° C. The temperature at which the aqueous phase and the organic phase are separated is also not particularly restricted, but is preferably 0 to 70° C., more preferably 10 to 60° C. in view of shorting the time for separating the phases.

The washed solution, which the polysiloxane is dissolved in the hydrophobic organic solvent used for washing, may be directly employed, but can be condensed, if necessary, to remove the solvent and remaining by-products, such as, alcohols and water, and thereby to change the concentration. Further, the solvent may be replaced with another solvent. The solution can be condensed under normal (atmospheric) pressure or reduced pressure, and the degree of condensation can be freely changed by controlling the distilled amount. The temperature in the condensation step is generally 30 to 150° C., preferably 40 to 100° C. According to the aimed solvent composition, a desired solvent may be added and then the solution may be further condensed to replace the solvent.

In the above manner, the polysiloxanes (H), (M) and (L) usable in the siloxane resin composition of the present invention can be produced. They can be mixed to prepare a polysiloxane (I).

Nowadays it is general to adopt a 2.38% TMAH aqueous solution as the developer, and hence the dissolution rates given by the polysiloxanes (M) and (I) are regulated to the above values. When another concentration of TMAH aqueous solution is used as the developer, the effect of the present invention can be similarly obtained if the rates are adjusted to be the same in the used developer as in the 2.38% TMAH aqueous solution. Further, even when not a TMAH solution but an aqueous solution of inorganic alkali such as sodium hydroxide is adopted as the developer, the effect can be obtained in the same manner.

(Measurement and Calculation of Alkali Dissolution Rate (ADR))

The dissolution rates given by the polysiloxanes (H), (M), (L) and a mixture thereof in a TMAH aqueous solution are measured and calculated in the following manner.

First, the polysiloxane is diluted with propyleneglycol monomethyletheracetate (hereinafter, referred to as "PGMEA") to be 35 wt %, and stirred and dissolved with a stirrer for 1 hour at room temperature. In a clean-room under an atmosphere of temperature: 23.0±0.5° C. and humidity: 50±5.0%, the prepared polysiloxane solution is then dropped with a pipet in an amount of 1 cc onto a 4-inch silicon wafer of 525 μm thickness at the center area, and spin-coated to form a coating of 2±0.1 μm thickness. Thereafter, the coating is heated for 90 seconds on a hot-plate at 100° C. to remove the solvent. The thickness of the coating is then measured with a spectro-ellipsometer (manufactured by J.A. Woollam).

Subsequently, the silicon wafer covered with the coating is placed in a 6 inch-diameter glass petri dish filled with 100 ml of a TMAH aqueous solution of predetermined concentration at 23.0±0.1° C., and left to be immersed. The time it takes for the coating to disappear is measured. The concentration of the TMAH solution is changed according to the kind of the polysiloxane. Specifically, it is 1.19% for the polysiloxane (H), 2.38% for the polysiloxane (M) or the mixture of (H), (M) and (L), or 5% for polysiloxane (L). The dissolution rate is obtained by dividing the initial thickness of the coating by the time it takes for the coating to dissolve and disappear in the area from the wafer edge to 10-mm inside. Otherwise, in the case where the dissolution rate is extremely slow, the wafer is immersed in the TMAH aqueous solution for a predetermined time and then heated for 5 minutes on a hot-plate at 200° C. to remove water soaked in the coating during the measurement of dissolution rate, and thereafter the thickness of the coating is measured. The thickness change between before and after the immersion is divided by the immersing time to obtain the dissolution rate. The measurement is repeated five times and the obtained values are averaged to determine the dissolution rate of the polysiloxane.

(II) Diazonaphthoquinone Derivative

The composition according to the present invention contains a diazonaphthoquinone derivative. This composition forms a positive type photoresist, in which a part in the exposed area becomes soluble in an alkali developer and thereby is removed by development. The diazonaphthoquinone derivative of the present invention can be regarded as a compound in which a naphthoquinone diazide sulfonic acid is ester-bonded with a phenolic hydroxyl-containing compound. There are no particular restrictions on the structure thereof, but the derivative is preferably an ester compound formed by esterification of a compound having one or more phenolic hydroxyl groups. Examples of the naphthoquinone diazide sulfonic acid include: 4-naphthoquinone diazide sulfonic acid and 5-naphthoquinone diazide sulfonic acid. Because of having an absorption band in the i-line region (wavelength: 365 nm), 4-naphthoquinone diazide sulfonate is suitable for i-line exposure. On the other hand, 5-naphthoquinone diazide sulfonate is suitable for exposure in a wide wavelength range because absorbing light in a wide wavelength region. Accordingly, it is preferred to select 4-naphthoquinone diazide sulfonate or 5-naphthoquinone diazide sulfonate according to the exposure wavelength. It is also possible to use both 4-naphthoquinone diazide sulfonate and 5-naphthoquinone diazide sulfonate in a mixture.

There are no particular restriction on the phenolic hydroxyl-containing compound. Examples thereof include the following compounds ([trademark], manufactured by Honshu Chemical Industry Co., Ltd.):

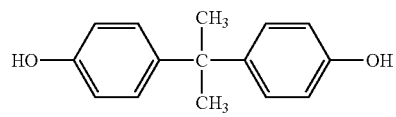

Bisphenol A

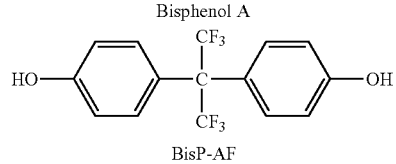

BisP-AF

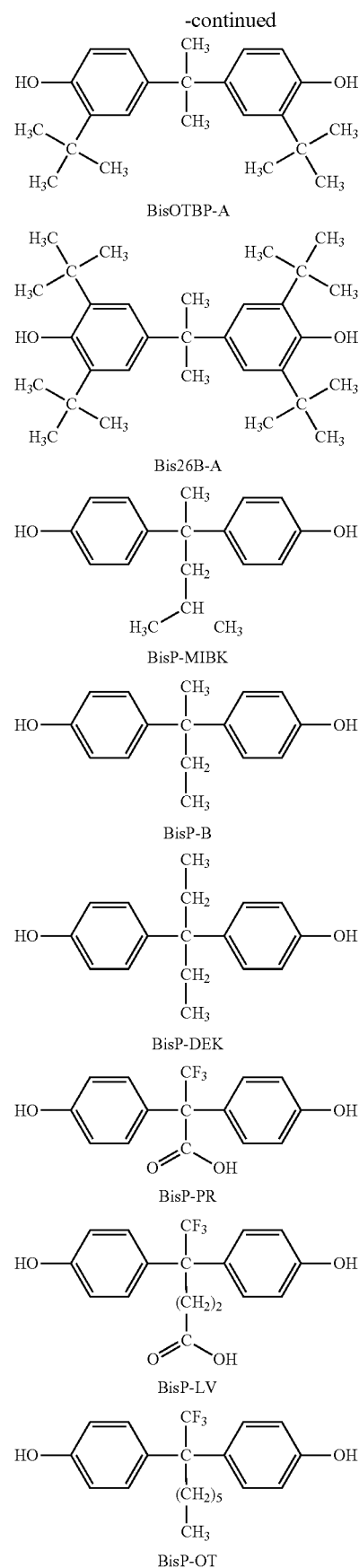

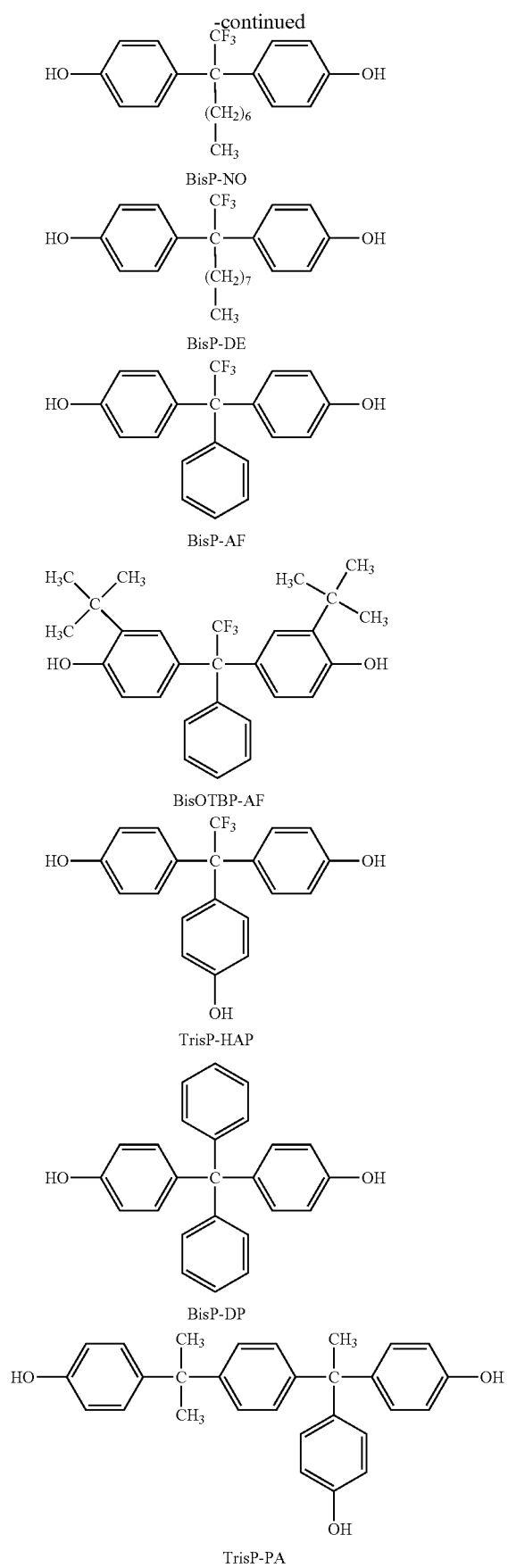
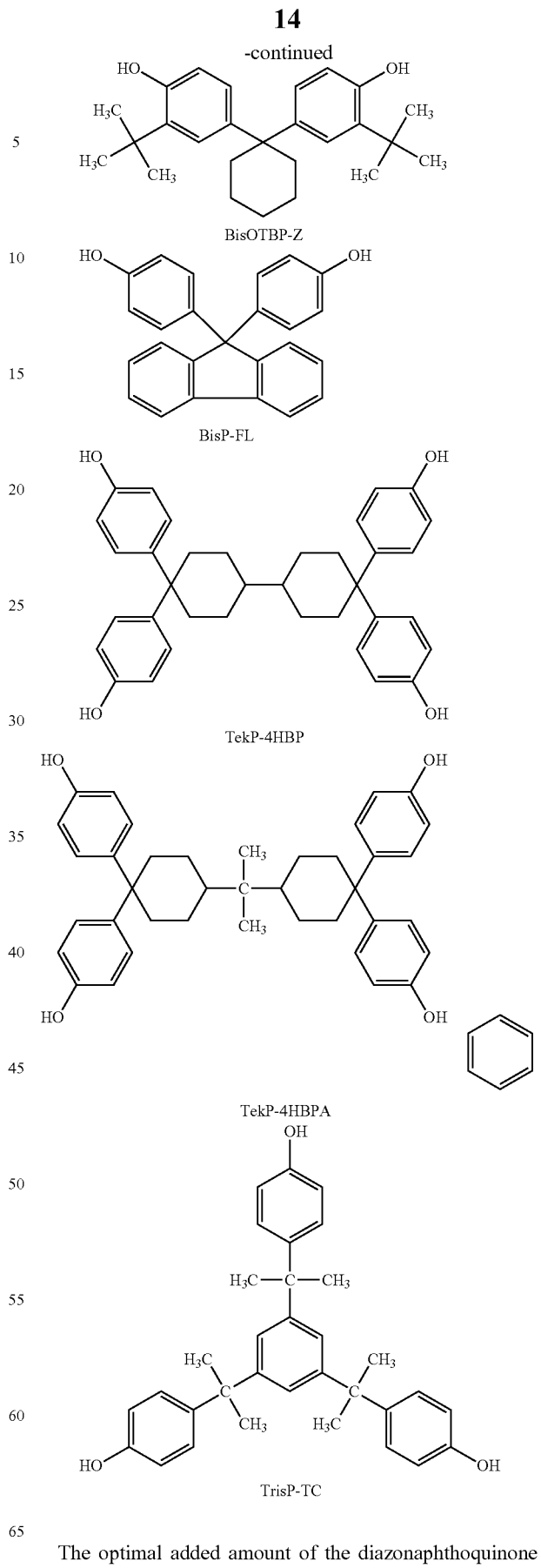
The optimal added amount of the diazonaphthoquinone derivative depends on the esterification ratio of naphthoquinone diazide sulfonic acid, on properties of the adopted polysiloxane, on the required sensitivity and on the required dissolution contrast between the exposed and unexposed areas. However, it is preferably 1 to 20 wt %, more preferably 3 to 15 wt %, based the total weight of the polysiloxanes (H), (M) and (L). If the amount is less than 1 wt %, the dissolution contrast between the exposed and unexposed areas is too low to obtain the practical photosensitivity. For realizing favorable dissolution contrast, the amount is preferably 3 wt % or more. If it is more than 20 wt %, the compatibility between the polysiloxane and the quinone diazide compound is so lowered that the coating film may be whitened. Further, when thermally cured, the formed film may be seriously colored by decomposition of the quinone diazide compound. As a result, the colorless transparency of the film may be impaired. Furthermore, the diazonaphthoquinone derivative is inferior to the polysiloxane in heat resistance, and hence if contained too much, the derivative may decompose by heating to lower the electric insulation of the cured film or to emit such gases as cause troubles in the post-treatments. Still further, it often deteriorates resistance of the cured film against a photoresist remover containing monoethanolamine or the like as a main ingredient.

(III) Hydrate or Solvate of a Photo Base-Generator

The composition according to the present invention contains a hydrate or solvate of a photo base-generator represented by the following formula (IIIa):

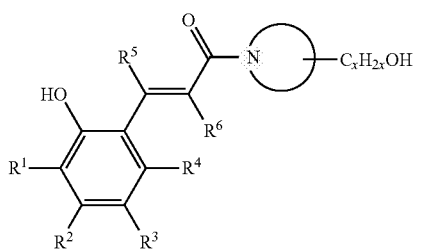

(IIIa)

In the above formula, x is an integer of 1 to 6 inclusive, each of $R^1$ to $R^6$ is independently hydrogen, a halogen, hydroxyl, mercapto, sulfide, silyl, silanol, nitro, nitroso, sulfino, sulfo, sulfonate, phosphine, phosphinyl, phosphono, phosphonato, amino, ammonium, an aliphatic hydrocarbon group of 1 to 20 carbon atoms which may have a substituent, an aromatic hydrocarbon group of 6 to 22 carbon atoms which may have a substituent, an alkoxy group of 1 to 20 carbon atoms which may have a substituent, or an aryloxy group of 6 to 20 carbon atoms which may have a substituent. Among the above, each of $R^1$ to $R^4$ is preferably independently hydrogen, hydroxyl, an aliphatic hydrocarbon group of 1 to 6 carbon atoms, or an alkoxy group of 1 to 6 carbon atoms; and each of $R^5$ and $R^6$ is particularly preferably hydrogen.

Two or more of $R^1$ to $R^4$ may be linked to form a cyclic structure, and the cyclic structure may contain a hetero atom.

In the above formula, N is a constituting atom of a nitrogen-containing heterocyclic ring having one or more hydroxyalkyl groups. The hydroxyalkyl group may be placed at any position of the ring, but is preferably connected to the p- or o-position. Further, the nitrogen-containing heterocyclic ring may have an aliphatic hydrocarbon group of 1 to 20, preferably 1 to 6 carbon atoms which may have a substituent, provided that the aliphatic hydrocarbon group is different from the above hydroxyalkyl group. The nitrogen-containing heterocyclic ring preferably has a hydroxyl group as the substituent because the solubility and the boiling point are both increased.

Each of $R^1$ to $R^4$ is preferably selected according to the employed exposure wavelength. For use in a display device, preferred are alkoxy groups, nitro group and unsaturated hydrocarbon-linking functional groups, such as vinyl and alkynyl, which have a function of shifting the absorption wavelength to the g-, h- or i-line region. Among those, methoxy and ethoxy are particularly preferred.

The photo base-generator in the present invention is not particularly restricted as long as represented by the formula (IIIa). Examples thereof are as follows:

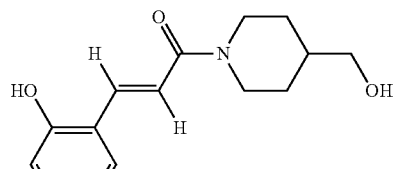

PBG-1

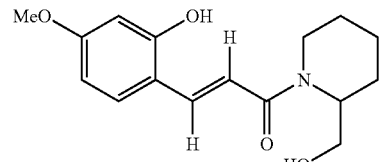

PBG-2

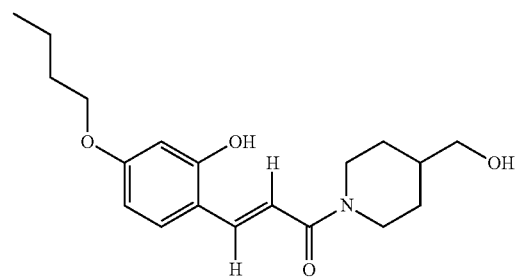

PBG-3

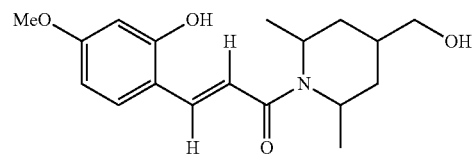

PBG-4

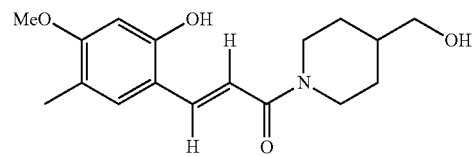

PBG-5

The composition according to the present invention contains the photo base-generator in the form of a hydrate or solvate. If the composition contains it in the form: of an anhydrate, the effect of the present invention cannot be fully obtained. Here, the "anhydrate" means a compound that is neither hydrated nor solvated. There are no particular restrictions on how to hydrate or solvate an anhydrate of the photo base-generator, and known methods can be adopted. For example, the photo base-generator anhydrate is added to water or a solvent under the condition where the amount of water or solvent is 10 times or more by weight of that of the anhydrate, and then the solution is stirred for about 1 hour at room temperature or above. For forming the solvate, the solvent is preferably capable of both dissolving the photo base-generator and being dissolved in water and also preferably has a boiling point lower than water. Examples of the solvent include THF and alcohols of 6 or less carbon atoms. Subsequently, excess of the solvent is distilled off from the obtained mixture with an evaporator, to obtain the hydrate or solvate. It can be verified by infrared (IR) absorption spectroscopy, by $^1$H-NMR or by thermogravimetry differential thermal analysis (TG-DTA) whether or not the resultant product is hydrated or solvated.

In another way, the photo base-generator in the form of an anhydrate may be mixed with water or solvent, stirred and then directly used without isolating the hydrate or solvate. Although the anhydrate or ansolvate in itself cannot provide the effect of the present invention, this procedure enables it to do so significantly.

The amount of water for hydration or solvent for solvation is necessarily more than 0 so as to ensure sufficient storage stability. Specifically, the amount thereof is 0.1 mol or more, preferably 1 mol or more based on 1 mol of the compound represented by the formula (IIIa).

When exposed to light, the compound of the formula (IIIa) converts its conformation into cis-form, which is unstable. Accordingly, the decomposition temperature thereof is so lowered that the compound can work as a polymer catalyst of siloxane even if the baking temperature is about 100° C. The generated base does not decompose phenyl groups and the main chain in the siloxane, but functions as a curing catalyst in the post heating and curing treatment. In this way, it becomes possible to obtain a desired shape without emitting benzene in curing.

The optimal added amount of the photo base-generator depends on properties of the used polysiloxanes, but is preferably 0.01 to 10 wt %, more preferably 0.5 to 5 wt % based on the total weight of the polysiloxanes (H), (M) and (L). If it is less than 0.01 wt %, the photo base-generator cannot fully function as a silanol condensation catalyst and consequently the polymer may suffer from thermal-flow caused by heating before undergoing curing condensation. If it is more than 10 wt %, the film obtained after curing may be seriously impaired in transparency and also may have poor durability against chemicals such as a resist remover.

(IV) Organic Solvent.

The composition according to the present invention contains an organic solvent.

Examples of the organic solvent include: ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol monoalkyl ether, such as, propylene glycol monomethyl ether and propylene glycol monoethyl ether; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; alcohols, such as, ethanol, propanol, butanol, hexanol, cyclohexanol, ethylene glycol, and glycerin; esters, such as, ethyl 3-ethoxypropionate, methyl 3-methoxypropionate and ethyl lactate; and cyclic asters, such as, γ-butyrolactone. Those solvents can be used singly or in combination of two or more, and the amount thereof depends on the coating method and the required thickness of the coating film.

For example, if the photosensitive siloxane composition is intended to be coated by spin-coating, the solid content thereof is often 15 to 65 wt % inclusive. If a slit-coating method, which is often adopted in coating a large substrate, is intended to be carried out, the solid content is normally 5 to 40 wt % inclusive. However, the amount of the solvent gives little effect to the properties of the positive type photosensitive siloxane composition according to the present invention.

The composition of the present invention necessarily comprises the above (I) to (IV), but can further comprise optional compounds in combination, if needed. Those combinable substances will be described below. The total amount of the ingredients other than (I) to (IV) is preferably 40% or less, more preferably 30% or less based on the whole weight.

(V) Additives

The composition of the present invention may contain other additives, if necessary. Examples of the additives include developer-dissolution promoter, scum remover, adhesion enhancer, polymerization inhibitor, defoaming agent, surfactant, and sensitizer.

The developer-dissolution promoter or the scum remover has functions of controlling solubility of the formed coating film in a developer and of preventing scum from remaining on the substrate after development. As this additive, crown ethers can be adopted. Crown ethers having the simplest structures are represented by the general formula: $(-CH_2-CH_2-O-)_n$. Among them, crown ethers of the formula in which n is 4 to 7 are preferably used in the present invention. Meanwhile, crown ethers are often individually referred to as "x-crown-y-ether" in which x and y represent the total number of atoms forming the ring and the number of oxygen atoms included therein, respectively. In the present invention, the additive is preferably selected from the group consisting of crown ethers of X=12, 15, 18 and 21 and y=x/3, benzo-condensed products thereof, and cyclohexyl-condensed products thereof. Preferred examples of the crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-15-crown-5-ether, and dicyclohexyl-12-crown-4-ether. Among them, it is particularly preferred to select the additive from the group consisting of 18-crown-6-ether and 15-crown-5-ether. The amount thereof is preferably 0.05 to 15 weight parts, more preferably 0.1 to 10 weight parts, based on 100 weight parts in total of the polysiloxanes.

If necessary, the composition of the present invention can further contain a surfactant, which is incorporated with the aim of improving coating properties, developability and the like. The surfactants usable in the present invention are, for example, nonionic, anionic and amphoteric surfactants.

Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-polyoxypropylene block polymer; acetylene alcohol; acetylene alcohol derivatives, such as polyethoxyate of acetylene alcohol; acetylene glycol; acetylnene glycol derivatives such as polyethoxyate of acetylene glycol; fluorine-containing surfactants, such as, Fluorad ([trademark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include:

ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammonium salts and organic amine salts of polyoxyethylenealkylether sulfuric acids, and ammonium salts and organic amine salts of alkylsulfuric acids.

Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 5000 ppm, preferably 100 to 3000 ppm based on the photosensitive siloxane composition of the present invention.

According to necessity, a sensitizer can be incorporated into the photosensitive siloxane composition of the present invention. Examples of the sensitizer preferably used in the composition of the present invention include coumarin, ketocoumarin, derivatives thereof, thiopyrylium salts, and acetophenone. Specifically, concrete examples thereof include: sensitizing dyes, such as, p-bis(o-methylstryl)benzene, 7-dimethylamino-4-methylquinolone-2,7-amino-4-methylcoumarin, 4,6-dimethyl-7-ethylaminocoumarin, 2-(p-dimethylaminostryl)pyridylmethyl iodide, 7-diethylaminocoumarin, 7-diethylamino-4-methylcoumarin, 2,3,5,6-1H,4H-tetrahydro-8-methylquinolidino-<9,9a,1gh>coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolidino<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolidino-<9,9a,1-gh>coumarin, 3-(2'-N-methylbenzimidazolyl)-7-N,N-diethylamino coumarin, N-methyl-4-trifluoromethylpiperidino-<3,2-g>coumarin, 2-(p-dimethylaminostryl)benzothiazolylethyl iodide, 3-(2'-benzimidazolyl)-7-N,N-diethylaminocoumarin, 3-(2'-benzothiazolyl)-7-N,N-diethylaminocoumarin, and pyrylium or thiopyrylium salts represented by the following formula (Va). The sensitizing dye makes it possible to carry out patterning by use of inexpensive light sources, such as, a high-pressure mercury lamp (360 to 430 nm).

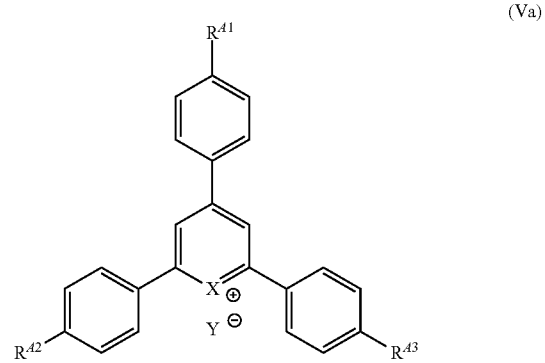

(Va)

| X | $R^{41}$ | $R^{42}$ | $R^{43}$ | Y |
|---|---|---|---|---|
| S | $OC_4H_9$ | H | H | $BF_4$ |
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| S | $OC_4H_9$ | H | H | $SbF_6$ |

As the sensitizer, it is also possible to adopt a compound having an anthracene skeleton. Concrete examples thereof include compounds represented by the following formula (VIb):

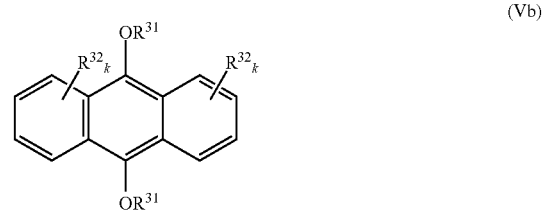

(Vb)

in which
each $R^{31}$ is independently a substituent group selected from the group consisting of alkyl groups, aralkyl groups, aryl groups, hydroxyalkyl groups, alkoxyalkyl groups, glycidyl groups and halogenated alkyl groups;
each $R^{32}$ is independently a substituent group selected from the group consisting of hydrogen, alkyl groups, alkoxy groups, halogen atoms, nitro groups, sulfonic acid groups, hydroxyl group, amino groups, and carboalkoxy groups; and
each k is independently an integer of 0 or 1 to 4.

When the sensitizer having an anthracene skeleton is added, the amount thereof is preferably 0.01 to 5 weight parts based on 100 weight parts in total of the polysiloxanes.

Examples of the polymerization inhibitor include nitrone, nitroxide radical, hydroquinone, catechol, phenothiazine, phenoxazine, hindered amine, derivatives thereof, and UV absorbers. Among them, preferred are catechol, 4-t-butylcatechol, 3-methoxycatechol, phenothiazine, chlorpromazine, phenoxazine, hindered amines such as TINUVIN 144, 292 and 5100 ([trademark], manufactured by BASF), and UV absorbers such as TINUVIN 326, 328, 384-2, 400 and 477 ([trademark], manufactured by BASF). Those can be used singly or in combination of two or more. The amount thereof is preferably 0.01 to 20 weight parts based on 100 weight parts in total of the polysiloxanes.

Examples of the defoaming agent include: alcohols ($C_1$ to $C_{18}$); higher fatty acids, such as, oleic acid and stearin acid; higher fatty acid esters, such as, glycerin monolaurate; polyethers, such as, polyethylenglycol (PEG) (Mn: 200 to 10000) and polypropyleneglycol (PPG) (Mn: 200 to 10000); silicone compounds, such as, dimethyl silicone oil, alkyl-modified silicone oil and fluoro-silicone oil; and organic siloxane surfactants described below in detail. Those can be used singly or in combination of two or more. The amount thereof is preferably 0.1 to 3 weight parts based on 100 weight parts in total of the polysiloxanes.

The adhesion enhancer has a function of preventing the pattern from being peeled off by stress coated after curing when a cured film is formed from the composition of the present invention. As the adhesion enhancer, imidazoles and silane coupling agents are preferably adopted. Examples of the imidazoles include 2-hydroxybenzimidazole, 2-hydroxyethylbenzimidazole, benzimidazole, 2-hydroxyimidazole, imidazole, 2-mercaptoimidazole, and 2-aminoimidazole. Among them, particularly preferred are 2-hydroxybenzimidazole, benzimidazole, 2-hydroxyimidazole and imidazole. Those can be used singly or in combination of two or more. The amount thereof is preferably 0.05 to 15 weight parts based on 100 weight parts in total of the polysiloxanes.

The composition of the present invention is coated on a substrate so as to form a coating film. This coating step can be carried out according to a common coating method, such as, immersion coating, roll coating, bar coating, brush coating, spray coating, doctor coating, flow coating, spin coating, or slit coating. Those are conventionally known as methods for applying a photosensitive siloxane composition. The substrate can be also appropriately selected from, for example, a silicon substrate, a glass substrate or a resin film. If the substrate is in the form of a film, gravure coating can be carried out. If desired, a drying step can be independently carried out after coating. Further, according to necessity, the coating step may be repeatedly carried out once or twice or more so as to form a coating film of desired thickness.

After the photosensitive siloxane composition of the present invention is coated to form a coating film, the film is preferably subjected to prebaking (preheating treatment) for the purposes of drying the film and of reducing the solvent remaining therein. The prebaking step is carried out at a temperature of generally 70 to 150° C., preferably 90 to 120° C. for 10 to 180 seconds, preferably 30 to 90 seconds on a hot-plate or for 1 to 30 minutes in a clean oven.

The following is an explanation of a method for forming a pattern from the positive type photosensitive siloxane composition of the present invention. In order to form a desired pattern, the composition is coated to form a coating film, which is then prebaked and subsequently pattern-wise exposed to light. Examples of the light source include high-pressure mercury lamp, low-pressure mercury lamp, metal halide lamp, xenon lamp, laser diode and LED. Light for the exposure is normally UV rays of g-line, h-line, i-line or the like. Except for in the case of ultrafine fabrication of semiconductors and the like, it is general to use light of 360 to 430 nm (high-pressure mercury lamp) for patterning in several micrometers to several tens of micrometers. Particularly in producing a liquid crystal display, light of 430 nm is often used. As described above, in that case, it is advantageous to combine a sensitizing dye with the photosensitive siloxane composition of the present invention. Energy of the exposure light depends on the light source and the initial thickness of the coating film, but is generally 10 to 2000 mJ/cm$^2$, preferably 20 to 1000 mJ/cm$^2$. If the exposure energy is lower than 10 mJ/cm$^2$, it is often difficult that a photo base-generator in the composition sufficiently decomposes. If it is more than 2000 mJ/cm$^2$, the coating film is exposed so excessively that the exposure may cause halation.

In order that the coating film can be pattern-wise exposed to light, common photomasks are employable. Those photomasks are known to those skilled in the art. There are no particular restrictions on the environmental conditions in the exposure, and the exposure can be carried out under an ambient atmosphere (the normal atmosphere) or under a nitrogen atmosphere. If a coating film is intended to be formed on the whole surface of the substrate, the whole substrate surface is exposed to light. In the present invention, the term "pattern film" includes a film thus formed on the whole surface of the substrate.

As a developer used in the development step, it is possible to adopt any developer employed in developing conventional photosensitive siloxane compositions. The developer is preferably an alkali developer, which is an aqueous solution of alkaline compound, such as, tetraalkylammonium hydroxide, choline, alkali metal hydroxide, alkali metal metasilicate (hydrate), alkali metal phosphate (hydrate), ammonia, alkylamine, alkanolamine, or heterocyclic amine. A particularly preferred alkali developer is an aqueous solution of tetraalkylammonium hydroxide. Those alkali developers may further contain surfactants or water-soluble organic solvents, such as, methanol and ethanol, if necessary. After developed with an alkali developer, the film is normally washed with water. Subsequently, the film is preferably subjected to bleaching exposure if intended to be used as a transparent film. The bleaching exposure photo-decomposes unreacted molecules of the diazonaphthoquinone derivative remaining in the film, and thereby improves photo-transparency of the film. In the bleaching exposure, the whole film surface is exposed to light at a dose of about 100 to 2000 mJ/cm$^2$ (in terms of reduced amount of exposure at 365 nm) by use of a UV-visible exposure unit, such as, PLA.

After developed, the pattern film is heated to cure. The heating temperature is not particularly restricted as long as the film can be cured, but normally 150 to 400° C., preferably 200 to 350° C. If it is lower than 150° C., some of the silanol groups remain unreacted to prevent the cured film from having sufficient chemical resistance. Further, the silanol groups have such polarity as to induce high permittivity, and hence the film is preferably cured at a temperature of 200° C. or above if the permittivity is intended to be lowered.

The thus obtained crosslinked cured film has a heat resistant temperature of 400° C. or above, a light-transmittance of 95% or more, and a specific permittivity of 4 or less, preferably 3.3 or less. Those characteristics of light transparency and specific permittivity are not realized by conventional acrylic materials, and hence the film can be advantageously used in various applications. For example, as described above, it can be adopted as a planarization film, an interlayer insulating film or a transparent protective film employed in various devices such as flat panel displays (FPDs), and also is employable as an interlayer insulating film for low temperature polysilicon or as a buffer coating film for IC chips. Further, the cured product can be used as an optical device element.

EXAMPLES

The present invention will be further explained concretely by use of the following examples and comparative examples. However, those examples and comparative examples by no means restrict the present invention.

Synthesis Examples

First, synthesis examples of polysiloxanes according to the present invention will be described below.

Measurements of gel permission chromatography (GPC) were carried out by use of HLC-8220GPC type high-speed GPC system ([trademark], manufactured by TOSOH CORPORATION) and Super Multipore HZ-N type GPC column ([trademark], manufactured by TOSOH CORPORATION) under the conditions of:

standard sample: monodispersed polystyrene,
developing solvent: tetrahydrofuran,
flow: 0.6 ml/minute, and
column temperature: 40° C.

Synthesis Example 1 (Synthesis of Polysiloxane (H): Alkali Catalyzed Synthesis)

In a 2-L reaction vessel equipped with a stirrer, a thermometer and a condenser, 39.2 g of a 25 wt % TMAH aqueous solution, 800 ml of isopropyl alcohol (IPA) and 2.0 g of water were placed. Independently, 39.7 g of phenyltrimethoxysilane, 34.1 g of methyltrimethoxysilane and 7.6 g of tetramethoxysilane were mixed to prepare a mixed solution, which was then placed in a dropping funnel. The mixed solution was dropped into the reaction vessel at 10° C., and successively the obtained mixture was stirred at the same temperature for 3 hours. Subsequently, 10% HCl aqueous solution was added to neutralize the mixture, and then 400 ml of toluene and 100 ml of water were added into the neutralized mixture, so that the mixture was separated into two layers. The organic layer was collected and condensed under reduced pressure to remove the solvent. To the obtained concentrate, PGMEA was added so that the solid content might be 40 wt %.

The molecular weight (in terms of polystyrene reduced value) of the obtained polysiloxane was measured by GPC to find the weight average molecular weight (hereinafter, often referred to as "Mw")=1400. Further, the obtained resin solution was coated on a silicon wafer so that the formed film might have a thickness of 2 µm after prebaked by means of a spin-coater (MS-A100 [trademark], manufactured by MIKASA Co., Ltd.), and then prebaked. Thereafter, the dissolution rate (hereinafter, often referred to as "ADR") in a 1.19% TMAH aqueous solution was measured and found to be 700 Å/second.

Synthesis Example 2 (Synthesis of Polysiloxane (M): Alkali Catalyzed Synthesis)

The procedure of Synthesis example 1 was repeated except for changing the amount of the TMAH aqueous solution into 32.5 g.

The molecular weight (in terms of polystyrene reduced value) of the obtained polysiloxane was measured by GPC to find Mw=1850. Further, the obtained resin solution was coated on a silicon wafer so that the formed film might have a thickness of 2 µm after prebaked by means of the spin-coater, and then prebaked. Thereafter, the ADR in a 2.38% TMAH aqueous solution was measured and found to be 1200 Å/second.

Synthesis Example 3 (Synthesis of Polysiloxane (L): Alkali Catalyzed Synthesis)

The procedure of Synthesis example 1 was repeated except for changing the amount of the TMAH aqueous solution into 25.5 g.

The molecular weight (in terms of polystyrene reduced value) of the obtained polysiloxane was measured by GPC to find Mw=2800. Further, the obtained resin solution was coated on a silicon wafer so that the formed film might have a thickness of 2 µm after prebaked by means of the spin-coater, and then prebaked. Thereafter, the ADR in a 5% TMAH aqueous solution was measured and found to be 420 Å/second.

Example 1 (Positive Type Photosensitive Siloxane Composition)

The solutions of polysiloxanes (H), (M) and (L) were mixed in a weight ratio of (20 wt %):(30 wt %):(50 wt %) in terms of solid content of each solution, to obtain a polysiloxane mixture. The mixture was converted to a 40% solution with a mixed solvent of PGMEA:γ-butyrolactone=9:1, and then 4-4'-(1-(4-(1-(4hydroxyphenol)-1methylethyl)phenyl) ethylidene)bisphenol derivative with 2.0 mol of diazonaphthoquinone (hereinafter referred to as "PAC") was added therein in an amount of 6 wt % based on the weight of the polysiloxane solution. Further, 3-(2-hydroxy-4-methoxyphenyl)-1-(1-(4-hydroxymethyl piperidine))-2-propene-1-on (PBG-1) monohydrate as the photo base-generator was added therein in an amount of 1 wt % based on the weight of the polysiloxane solution. Finally, AKS-10 ([trademark], manufactured by Shin-Etsu Chemical Co., Ltd.) serving as the surfactant was incorporated in an amount of 0.1 wt % based on the weight of the polysiloxane solution, to obtain a photosensitive siloxane composition.

The photosensitive siloxane composition was coated on a silicon wafer by spin-coating, and then prebaked on a hot-plate at 100° C. for 90 seconds so as to form a film of 1 µm thickness. After prebaked, the film was subjected to exposure at 150 ml/cm$^2$ by means of g- and h-line exposure system FX-604 (NA=0.1) ([trademark], manufactured by Nikon Corporation). Subsequently, the film was developed for 100 seconds in a 2.38% TMAH aqueous solution, and rinsed with pure water. Thereafter, it was verified by SEM observation that 3-µm line-and-space (L/S) and contact-hole (C/H) patterns were formed and also that there was no residue left.

(Evaluation of Storage Stability)

The required exposure amount for the composition was defined as such a dose as provided a-line-and-space width ratio of 1:1 in the 3-µm line-and-space pattern. If the required exposure amount was changed only within a range of ±5% or if the line width in the pattern was changed only within a range of ±5% even after the pattern was stored at 5° C. for 30 days, the composition was judged to have no problem on the storage stability.

The produced composition showed any change neither in the sensitivity nor in the pattern shape.

(Evaluation of Emissions Derived from Aromatic Groups)

Each positive type photosensitive composition solution was coated on a silicon wafer with a spinner, to form a film of 0.6 µm thickness. The film was analyzed by means of a silicon wafer-surface organic compound microanalyzer (SWA256 [trademark], manufactured by GL Sciences Inc.) and a mass analyzer (HP7890B/5977A [trademark], manufactured by Agilent technologies). While the 0.6 µm-thick film was gradually heated over 2 hours to 300° C., the peak area given by benzene emitted from the film was measured. The results are shown in Table 1. If the measured value is low, the cured film can be judged to emit only a small amount of substances derived from aromatic groups and hence to outgas the substances derived from aromatic groups only in a small amount.

The sample was subjected to C-V measurement at a measurement frequency of 100 KHz by use of a capacitance measuring apparatus 495 ([trademark], manufactured by Solid State Instrument) according to a mercury probe method, to obtain the saturated capacitance, from which the specific permittivity was calculated. The sample for the measurement was prepared by the steps of: coating the photosensitive siloxane composition on a silicon wafer by spin-coating, prebaking the coated composition on a hot-plate at 100° C. for 90 seconds so as to form a film of 0.5 μm thickness, exposing the whole film to light at a dose for forming a pattern (320 mJ/cm² in Example 1) by means of g- and h-line exposure system FX-604 (NA=0.1) ([trademark], manufactured by Nikon Corporation), post-baking the exposed film, on a hot-plate at 100° C. for 90 seconds, then immersing the film in a 2.38% TMAH aqueous solution for 30 seconds, followed by rinsing with pure water, and finally curing the film at 250° C. As a result, it was found that the obtained cured product had a specific permittivity of 3.3.

Examples 2 to 12

The procedure of Example 1 was repeated except that the ingredients and the processing conditions were changed into those shown in Table 1, to produce compositions, which were evaluated in the same manner as in Example 1. The results are shown in Tables 1-1 and 1-2.

[Table 1-1]

TABLE 1-1

|  | Example 1 | Example 2 | Example 3 | Example 4 | Example 5 |
| --- | --- | --- | --- | --- | --- |
| polysiloxane | H:M:L = 2:3:5 | H:M:L = 2:3:5 | H:M:L = 2:3:5 | H:M:L = 2:3:5 | H:M:L = 3:3:4 |
| photo base-generator | PBG1•1hydrate | PBG1•1hydrate twice as much as that in Example 1 | PBG1•1hydrate three times as much as that in Example 1 | PBG1•1hydrate | PBG1•1hydrate |
| prebaking | 100 C./90 s | 100 C./90 s | 100 C./90 s | 100 C./90 s | 120 C./90 s |
| film thickness | 2.5 μm | 2.5 μm | 2.5 μm | 5 μm | 2.5 μm |
| exposure dose | 320 mJ/cm² | 265 mJ/cm² | 210 mJ/cm² | 400 mJ/cm² | 220 mJ/cm² |
| developing time | 100 s | 100 s | 100 s | 100 s | 100 s |
| resolution | 3 μm C/H OK | 3 μm C/H OK | 3 μm C/H OK | 10 μm L/S OK | 3 μm C/H OK |
| temporal stability | OK | OK | OK | OK | OK |
| substance derived from aromatic group | not detected | not detected | not detected | not detected | not detected |
| resolution after cured at 230° C. | 3 μm C/H OK | 3 μm C/H OK | 3 μm C/H OK | 10 μm L/S OK | 3 μm C/H OK |

TABLE 1-2

|  | Example 6 | Example 7 | Example 8 | Example 9 | Example 10 | Example 11 |
| --- | --- | --- | --- | --- | --- | --- |
| polysiloxane | H:M:L = 3:2.7:4.3 | H:M:L = 2:3:5 | H:M:L = 2:3:5 | H:M:L = 2:3:5 | H:M:L = 2:3:5 | H:M:L = 2:3:5 |
| photo base-generator | PBG1•1hydrate | PBG1•1hydrate | PBG2•1hydrate | PBG3•hydrate* | PBG4•hydrate* | PBG5•hydrate* |
| prebaking | 100 C./90 s | 100 C./90 s | 100 C./90 s | 100 C./90 s | 100 C./90 s | 100 C./90 s |
| film thickness | 2.5 μm | 2.5 μm | 2.5 μm | 2.5 μm | 2.5 μm | 2.5 μm |
| exposure dose | 160 mJ/cm² | 300 mJ/cm² | 300 mJ/cm² | 300 mJ/cm² | 300 mJ/cm² | 300 mJ/cm² |
| developing time | 100 s | 100 s | 100 s | 100 s | 100 s | 100 s |
| resolution | 3 μm C/H OK | 3 μm C/H OK | 3 μm C/H OK | 3 μm C/H OK | 3 μm C/H OK | 3 μm C/H OK |
| temporal stability | OK | OK | OK | OK | OK | OK |
| substance derived from aromatic group | not detected | not detected | not detected | not detected | not detected | not detected |
| resolution after cured at 230° C. | 3 μm C/H OK | 3 μm C/H OK | 3 μm C/H OK | 3 μm C/H OK | 3 μm C/H OK | 3 μm C/H OK |

*Each of PBG3•hydrate, PBG4•hydrate and PBG5•hydrate is a mono- or multi-hydrate.

Each sample was exposed to light by means of g- and h-line exposure system FX-604 (NA=0.1) ([trademark], manufactured by Nikon Corporation) through a mask in which the line widths of shading and exposing areas were in a ratio of 1:1. Each dose in the tables indicates an exposure amount providing a minimum pattern which was observed by SEM after development to have shading and exposing areas in a width ratio of 1:1.

Comparative Examples 1 to 5

The procedure of Example 1 was repeated except that the ingredients and the processing conditions were changed into those shown in Table 2, to produce compositions, which were evaluated in the same manner as in Example 1. The results are shown in Table 2.
[Table 2]

TABLE 2

|  | Com. Ex. 1 | Com. Ex. 2 | Com. Ex. 3 | Com. Ex. 4 | Com. Ex. 5 |
|---|---|---|---|---|---|
| polysiloxane | H:M:L = 2:3:5 | H:M:L = 2:3:5 | H:M:L = 2:3:5 | H:M:L = 2:3:5 | H:M:L = 2:3:5 |
| photo base-generator | PBG1·anhydrate | PBG6·anhydrate | PBG7·anhydrate | PBG8·anhydrate | absent |
| prebaking | 100 C./90 s | 100 C./90 s | 100 C./90 s | 100 C./90 s | 100 C./90 s |
| film thickness | 2.5 μm | 2.5 μm | 2.5 μm | 2.5 μm | 2.5 μm |
| exposure dose | NG | NG | NG | 400 mJ/cm$^2$ | 320 mJ/cm$^2$ |
| developing time | 100 s | 100 s | 100 s | 100 s | 100 s |
| resolution | NG | NG | NG | 3 μm C/H OK | 3 μm C/H OK |
| temporal stability | NG | NG | NG | NG | NG |
| substance derived from aromatic group | not detected | not detected | not detected | Benzene was detected | not detected |
| resolution after cured at 230° C. | NG | NG | NG | 3 μm C/H OK | NG |

Comparative Example 6

The procedure of Comparative example 1 was repeated except for finally adding water in an amount ten times by mol of the photo base-generator, to produce a composition, which was evaluated in the same manner as in Example 1. The results are shown in Table 3.
[Table 3]

TABLE 3

|  | Example 1 | Com. Ex. 6 |
|---|---|---|
| polysiloxane | H:M:L = 2:3:5 | H:M:L = 2:3:5 |
| photo base-generator | PBG1·1hydrate | PBG1·anhydrate |

TABLE 3-continued

|  | Example 1 | Com. Ex. 6 |
|---|---|---|
| prebaking | 100 C./90 s | 100 C./90 s |
| film thickness | 2.5 μm | 2.5 μm |
| exposure dose | 320 mJ/cm$^2$ | NG |
| developing time | 100 s | 100 s |
| resolution | 3 μm C/H OK | NG |
| temporal stability | OK | NG |
| substance derived from aromatic group | not detected | not detected |
| resolution after cured at 230° C. | 3 μm C/H OK | NG |

INDUSTRIAL APPLICABILITY

When employed for manufacture of semiconductor devices and the like, the positive type photosensitive siloxane composition according to the present invention hardly emits volatile substances, which may pollute the production system in the production process. Further, the composition makes it possible to form a pattern having high optical transparency, tough temperature durability, strong chemical resistance, good environmental resistance and excellent storage stability. Furthermore, it is also characteristic of the composition to reduce pattern defects caused by development residues, by undissolved residues or by reattached hardly-soluble trace left in pattern formation.

Patterns or cured films formed from the composition are favorably employed as interlayer insulating films in semiconductor devices or as planarization films on thin-film transistor (TFT) substrates, which are used as backplanes of

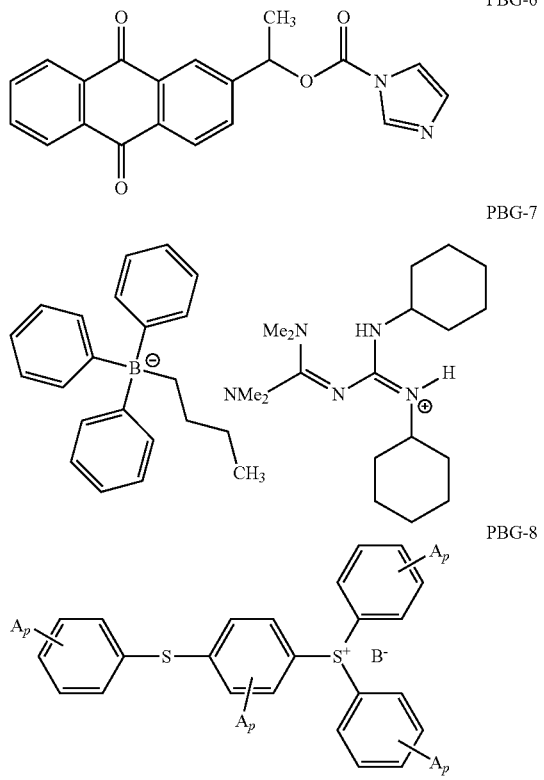

PBG-6

PBG-7

PBG-8

A = phenyl,
p = 1, and
B$^-$ = (C$_6$F$_5$)$_4$B$^-$.

displays such as LCD devices or organic EL devices. Moreover, they are also advantageously used for optical elements, such as, solid state image sensors, antireflection panels or films, optical filters, high brightness LED devices, touch panels, solar cells and optical waveguides.

The invention claimed is:

1. A positive type photosensitive siloxane composition, comprising:
   (I) a polysiloxane having a phenyl group,
   (II) a diazonaphthoquinone derivative,
   (III) a hydrate or solvate of a photo base-generator represented by the following formula (IIIa):

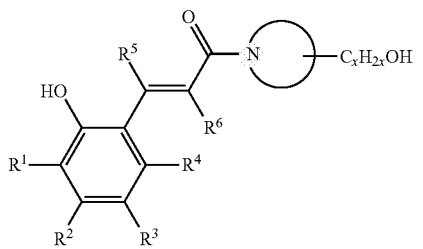

(IIIa)

in which
x is an integer of 1 to 6 inclusive,
each of $R^1$ to $R^6$ is independently hydrogen, a halogen, hydroxyl, mercapto, sulfide, silyl, silanol, nitro, nitroso, sulfino, sulfo, sulfonate, phosphino, phosphinyl, phosphono, phosphonato, amino, ammonium, an aliphatic hydrocarbon group of 1 to 20 carbon atoms which may have a substituent, an aromatic hydrocarbon group of 6 to 22 carbon atoms which may have a substituent, an alkoxy group of 1 to 20 carbon atoms which may have a substituent, or an aryloxy group of 6 to 20 carbon atoms which may have a substituent, two or more of $R^1$ to $R^4$ may be linked to form a cyclic structure, wherein
said cyclic structure may contain a hetero atom, and
N is a constituting atom of a nitrogen-containing heterocyclic ring, wherein
said nitrogen-containing heterocyclic ring is a 3- to 10-membered ring, and
said nitrogen-containing heterocyclic ring may further contain an aliphatic hydrocarbon group of 1 to 20 carbon atoms which may have a substituent, provided that said aliphatic hydrocarbon group is different from the $C_xH_{2x}OH$ group, and
(IV) an organic solvent.

2. The composition according to claim 1, wherein said ingredient (III) is a hydrate of the photo base-generator represented by the formula (IIIa).

3. The composition according to claim 1, wherein said nitrogen-containing heterocyclic ring in said photo base-generator is a six-membered ring.

4. The composition according to claim 1, wherein said nitrogen-containing heterocyclic ring in said photo base-generator has only one substituent.

5. The composition according to claim 3, wherein said nitrogen-containing heterocyclic ring in said photo base-generator has only one substituent.

6. The composition according to claim 1, wherein said polysiloxane has a weight average molecular weight of 800 to 8000.

7. The composition according to claim 4, wherein said polysiloxane has a weight average molecular weight of 800 to 8000.

8. The composition according to claim 1, which further comprises a scum remover.

9. The composition according to claim 7, which further comprises a scum remover.

10. The composition according to claim 1, which further comprises a surfactant.

11. The composition according to claim 9, which further comprises a surfactant.

12. A method for producing a positive type photosensitive siloxane composition, comprising the step of mixing
   (I) a polysiloxane having a phenyl group,
   (II) a diazonaphthoquinone derivative,
   (III) a hydrate or solvate of a photo base-generator represented by the following formula (IIIa):

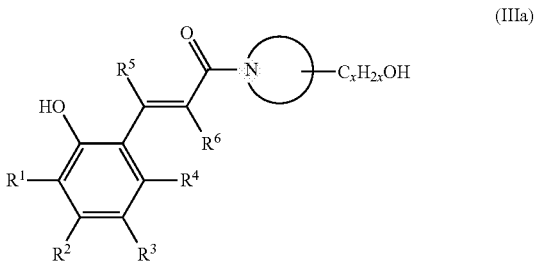

(IIIa)

in which
x is an integer of 1 to 6 inclusive,
each of $R^1$ to $R^6$ is independently hydrogen, a halogen, hydroxyl, mercapto, sulfide, silyl, silanol, nitro, nitroso, sulfino, sulfo, sulfonate, phosphino, phosphinyl, phosphono, phosphonato, amino, ammonium, an aliphatic hydrocarbon group of 1 to 20 carbon atoms which may have a substituent, an aromatic hydrocarbon group of 6 to 22 carbon atoms which may have a substituent, an alkoxy group of 1 to 20 carbon atoms which may have a substituent, or an aryloxy group of 6 to 20 carbon atoms which may have a substituent, two or more of $R^1$ to $R^4$ may be linked to form a cyclic structure, wherein
said cyclic structure may contain a hetero atom, and
N is a constituting atom of a nitrogen-containing heterocyclic ring, wherein
said nitrogen-containing heterocyclic ring is a 3- to 10-membered ring, and
said nitrogen-containing heterocyclic ring may further contain an aliphatic hydrocarbon group of 1 to 20 carbon atoms which may have a substituent, provided that said aliphatic hydrocarbon group is different from the $C_xH_{2x}OH$ group, and
(IV) an organic solvent.

13. A positive type photosensitive siloxane composition produced by the method according to claim 12.

14. A cured film formed from comprising coating the positive type photosensitive siloxane composition according to claim 1 on a substrate and then heating the substrate.

15. A cured film formed from comprising coating the positive type photosensitive siloxane composition according to claim 11 on a substrate and then heating the substrate.

16. A device comprising the cured film according to claim 14.

17. A device comprising the cured film according to claim 15.

* * * * *